(12) United States Patent
Baek et al.

(10) Patent No.: US 11,342,402 B2
(45) Date of Patent: May 24, 2022

(54) DISPLAY DEVICE

(71) Applicant: SAMSUNG DISPLAY CO., LTD., Yongin-si (KR)

(72) Inventors: Gyungmin Baek, Yongin-si (KR); Juhyun Lee, Yongin-si (KR); Sangwon Shin, Yongin-si (KR); Hyuneok Shin, Yongin-si (KR); Dongmin Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/126,657

(22) Filed: Sep. 10, 2018

(65) Prior Publication Data

US 2019/0181210 A1    Jun. 13, 2019

(30) Foreign Application Priority Data

Dec. 12, 2017  (KR) .................... 10-2017-0170509

(51) Int. Cl.
| | |
|---|---|
| *H01L 27/32* | (2006.01) |
| *G09G 3/3291* | (2016.01) |
| *H01L 27/12* | (2006.01) |
| *H01L 29/45* | (2006.01) |
| *H01L 29/786* | (2006.01) |

(52) U.S. Cl.
CPC ....... *H01L 27/3276* (2013.01); *G09G 3/3291* (2013.01); *H01L 27/124* (2013.01); *H01L 27/32* (2013.01); *H01L 27/3244* (2013.01); *H01L 27/3248* (2013.01); *H01L 27/3258* (2013.01);

(Continued)

(58) Field of Classification Search
None
See application file for complete search history.

(56) References Cited

U.S. PATENT DOCUMENTS

| | | |
|---|---|---|
| 7,615,867 B2 | 11/2009 | Kim et al. |
| 7,663,146 B2 | 2/2010 | Tanaka et al. |

(Continued)

FOREIGN PATENT DOCUMENTS

| | | |
|---|---|---|
| EP | 2966705 | 1/2016 |
| KR | 1020040059698 | 7/2004 |

(Continued)

OTHER PUBLICATIONS

European Search Report dated Apr. 12, 2019 in corresponding European Patent Application No. 18208408.7 (8 pages).

*Primary Examiner* — Anthony Ho
*Assistant Examiner* — Kevin Quinto
(74) *Attorney, Agent, or Firm* — F. Chau & Associates, LLC

(57) ABSTRACT

A display device includes a substrate including a display area and a peripheral area outside the display area. A circuit unit is disposed in the display area and includes a semiconductor layer. An insulating layer is on the semiconductor layer. A conductive layer is connected to the semiconductor layer through a contact hole in the insulating layer. The conductive layer includes an underlayer including a metal nitride including a first metal. A display element is disposed on the circuit unit and includes a pixel electrode electrically connected to the conductive layer. A connection layer is disposed under the conductive layer. The connection layer corresponds to the contact hole and includes a second metal.

24 Claims, 11 Drawing Sheets

(52) U.S. Cl.
CPC ........ *H01L 27/3279* (2013.01); *H01L 29/458* (2013.01); *H01L 29/78618* (2013.01)

(56) References Cited

U.S. PATENT DOCUMENTS

| | | | |
|---|---|---|---|
| 9,673,267 B2 | 6/2017 | Kim et al. | |
| 9,954,166 B1* | 4/2018 | Lin | ................. H01L 45/124 |
| 2004/0072380 A1* | 4/2004 | Yamazaki | ........... H01L 27/3246 438/30 |
| 2005/0029521 A1* | 2/2005 | Yamasaki | ......... G02F 1/136213 257/72 |
| 2007/0020910 A1 | 1/2007 | Park et al. | |
| 2008/0251785 A1 | 10/2008 | Noh et al. | |
| 2011/0233529 A1 | 9/2011 | Chung et al. | |
| 2014/0248761 A1* | 9/2014 | Park | ................ H01L 21/823871 438/586 |
| 2016/0351638 A1 | 12/2016 | Im et al. | |

FOREIGN PATENT DOCUMENTS

| | | |
|---|---|---|
| KR | 1020050099955 | 10/2005 |
| KR | 1020070045770 | 5/2007 |
| KR | 100830318 | 5/2008 |
| KR | 10-2014-0117041 | 10/2014 |

\* cited by examiner

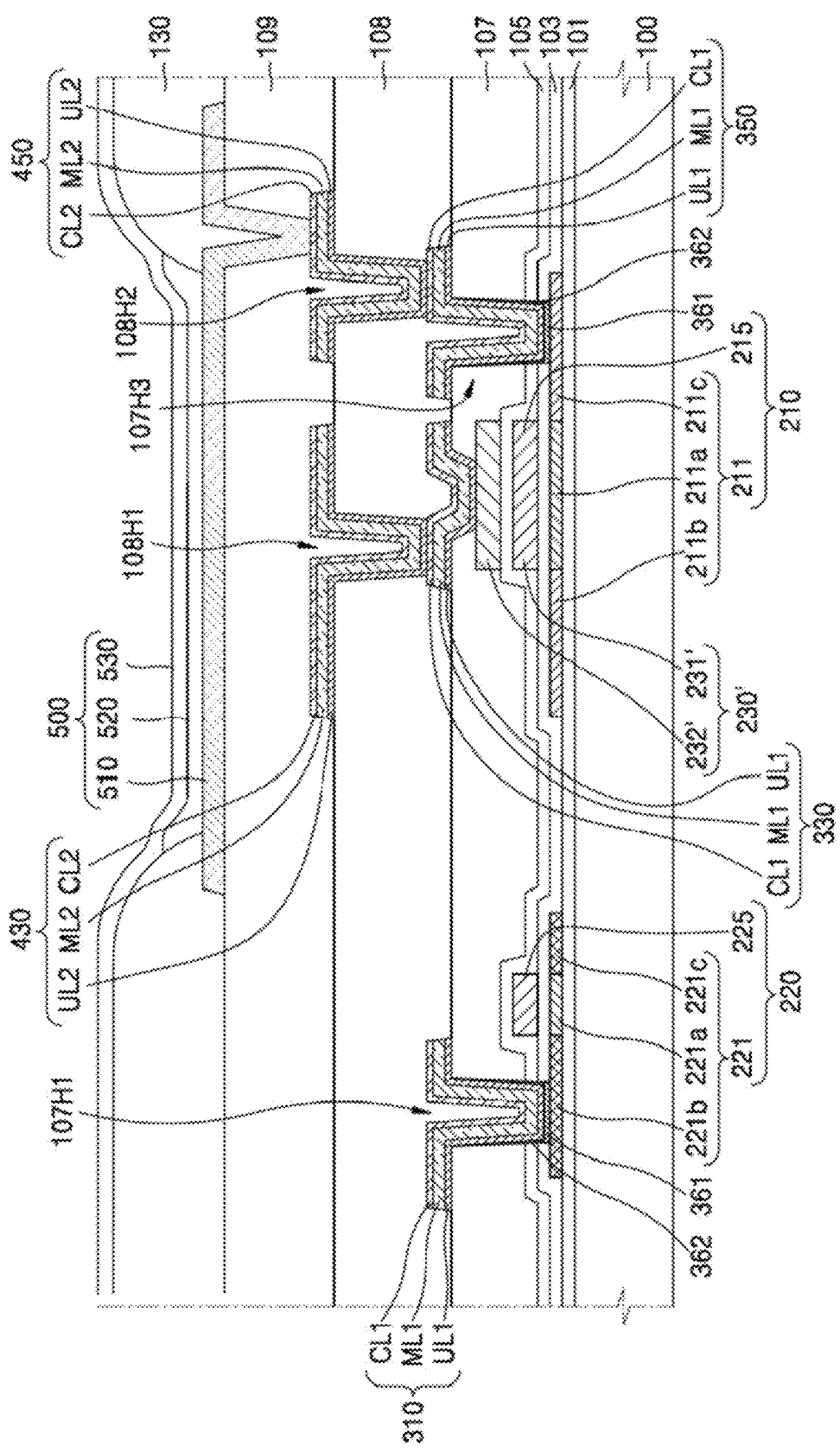

DISPLAY DEVICE

CROSS-REFERENCE TO RELATED APPLICATION

This application claims priority under 35 U.S.C. § 119 to Korean Patent Application No. 10-2017-0170509, filed on Dec. 12, 2017, in the Korean Intellectual Property Office, the disclosure of which is incorporated by reference herein in its entirety.

1. Technical Field

Exemplary embodiments of the present invention relate to a display device.

2. Discussion of Related Art

A display device may include a display element and electronic elements controlling an electric signal applied to the display element. The electronic elements may include a thin film transistor (TFT), a capacitor, and a plurality of wirings. The electronic elements may be electrically insulated from each other by an insulating layer therebetween, or may be electrically connected to each other through a contact hole formed in the insulating layer.

SUMMARY

An insulating layer between electronic elements of a display device may react with a conductive layer of the electronic elements, thus forming an unexpected layer (e.g., depending on a material of the insulating layer). The unexpected layer may appear as a stain to users.

A display device according to an exemplary embodiment of the present invention may prevent a layer from being formed between a conductive layer and an insulating layer, which may increase a quality of a generated image.

According to an exemplary embodiment of the present invention, a display device includes a substrate including a display area and a peripheral area outside the display area. A circuit unit is disposed in the display area and includes a semiconductor layer. An insulating layer is on the semiconductor layer. A conductive layer is connected to the semiconductor layer through a contact hole in the insulating layer. The conductive layer includes an underlayer including a metal nitride including a first metal. A display element is disposed on the circuit unit and includes a pixel electrode electrically connected to the conductive layer. A connection layer is disposed under the conductive layer to correspond to the contact hole. The connection layer includes a second metal.

The insulating layer may include an organic insulating layer.

A part of a lower surface of the conductive layer may be in direct contact with n upper surface of the insulating layer.

The display device may include a side layer located on at least a part of an inner wall of the contact hole. The side layer may include the second metal.

The underlayer may include at least one of titanium nitride, tantalum nitride, niobium nitride, or tungsten nitride.

The conductive layer may include a metal layer disposed on the underlayer.

The metal layer may include at least one of Mo, Al, Cu, or Ti.

A thickness of the metal layer may be greater than a thickness of the underlayer.

A thickness of the underlayer may be about 30 Å or more.

The connection layer may be a metal silicide layer including the second metal.

The display element may include an organic light-emitting diode.

According to an exemplary embodiment of the present invention, a display device includes a substrate including a display area and a peripheral area outside the display area. A circuit unit is disposed in the display area. The circuit unit includes a semiconductor layer, a conductive layer and an organic insulating layer. A lower portion of the conductive layer is in direct contact with an organic insulating layer. The lower portion of the conductive layer includes a metal nitride. A display element disposed on the circuit unit and includes a pixel electrode electrically connected to the conductive layer.

A part of a lower surface of the conductive layer may be in direct contact with the organic insulating layer.

The conductive layer may include a metal nitride layer and a metal layer disposed on the metal nitride layer.

The metal nitride layer may include at least one of titanium nitride, tantalum nitride, niobium nitride, or tungsten nitride.

The metal layer may include at least one of Mo, Al, Cu, or Ti.

The conductive layer may include a cover layer on the metal layer.

A thickness of the metal nitride layer may be about 30 Å or more.

A thickness of the metal layer may be greater than a thickness of the metal nitride layer.

The conductive layer may be connected to the semiconductor layer through a contact hole in the organic insulating layer.

The display device may include a metal silicide layer disposed under the lower portion of the conductive layer.

The display device may include a side layer covering at least a part of an inner wall of the contact hole. A metal included in the side layer is the same as a metal included in the metal silicide layer.

The conductive layer may directly contact a metal element disposed under the organic insulating layer through a contact hole in the organic insulating layer.

The circuit unit may include a storage capacitor. The metal element may be an electrode of the storage capacitor.

The circuit unit may include a thin film transistor. A data line and a driving voltage line may be electrically connected to the thin film transistor. The conductive layer may be one of the data line or the driving voltage line.

BRIEF DESCRIPTION OF THE DRAWINGS

A more complete appreciation of the present invention will become more apparent by describing in detail exemplary embodiments thereof with reference to the accompanying drawings, in which:

FIG. 11 is a cross-sectional view of a display area of a display device according to an exemplary embodiment of the present invention.

DETAILED DESCRIPTION

Figure 1:
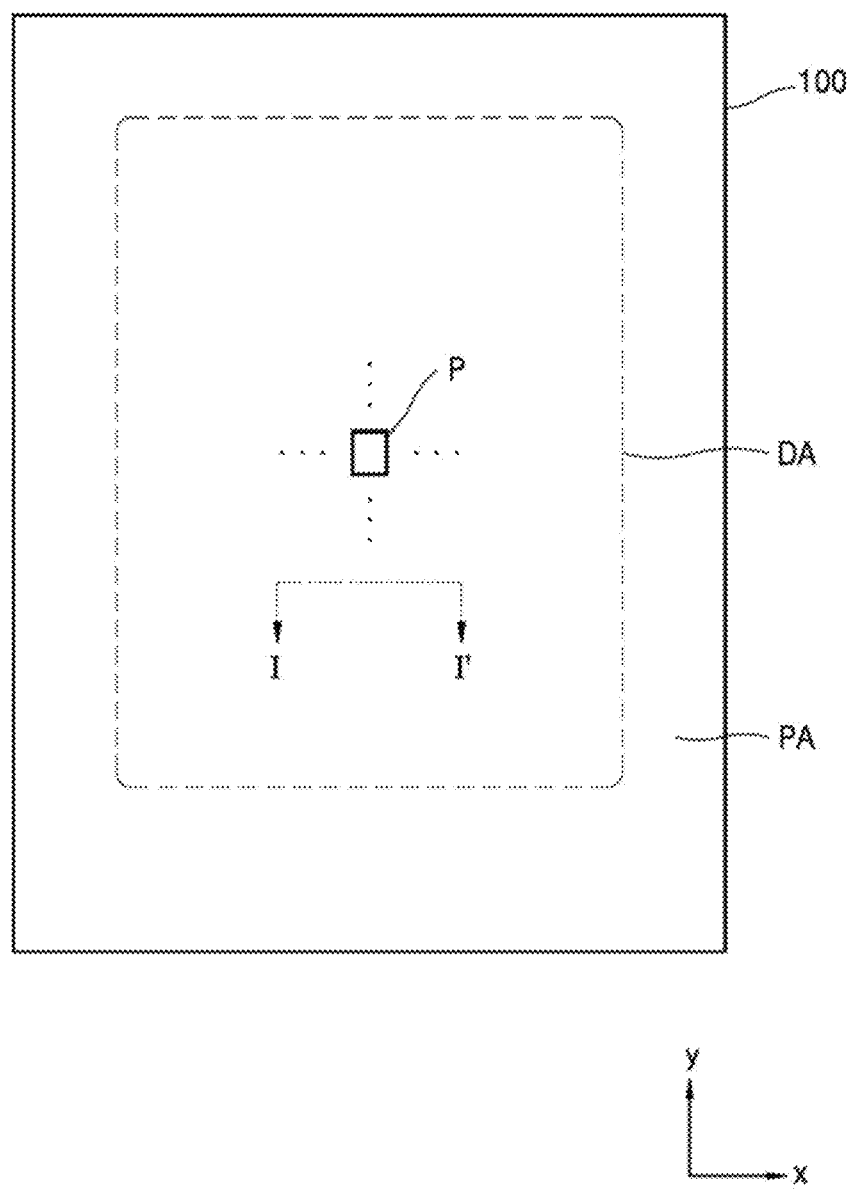
FIG. 1 is a plan view of a display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings.

It will be understood that although the terms "first" and "second" may be used herein to describe various components, these components should not be limited by these terms.

As used herein, the singular forms "a," "an" and "the" may include the plural forms as well, unless the context clearly indicates otherwise.

It will be understood that when a component, such as a layer, a film, a region, or a plate, is referred to as being "on" another component, the component may be directly on the other component or intervening components may be present.

Sizes of elements in the drawings may be exaggerated for clarity of description.

When a certain embodiment may be implemented differently, a specific process order may be performed differently from the described order. For example, two consecutively described processes may be performed substantially at the same time or performed in an order opposite to (or otherwise different from) the described order.

It will be understood that when a layer, region, or component is referred to as being "connected" to another layer, region, or component, it may be "directly connected" to the other layer, region, or component or may be "indirectly connected" to the other layer, region, or component with other layer, region, or component disposed therebetween.

A display device may display an image. Examples of the display device may include a liquid crystal display, an electrophoretic display, an organic light-emitting display, an inorganic light-emitting display, a field emission display, a surface-conduction electron-emitter display, a plasma display, or a cathode ray display.

An organic light-emitting display is primarily described below as an example. However, the display device according exemplary embodiments of the present invention is not limited thereto and various types of display devices may be used.

FIG. 1 is a plan view of a display device according to an exemplary embodiment of the present invention.

Referring to FIG. 1, a display device may include a substrate 100. The substrate 100 may include a display area DA and a peripheral area PA outside the display area DA. As an example, the peripheral area PA may surround the display area DA (e.g., when viewed in a plan view along a direction orthogonal to an upper surface of the substrate 100). The peripheral region PA may have a substantially uniform width around the display area DA; however, exemplary embodiments of the present invention are not limited thereto. Display elements such as an organic light-emitting diode (OLED) may be arranged in the display area DA of the substrate 100. The peripheral area PA of the substrate 100 may be a non-display area which does not display an image. Wirings transferring an electric signal to be applied to the display area DA may be located in the peripheral area PA. As an example, a display device including an OLED as a display element is described in more detail below. However, exemplary embodiments of the present invention are not limited thereto.

Figure 2:
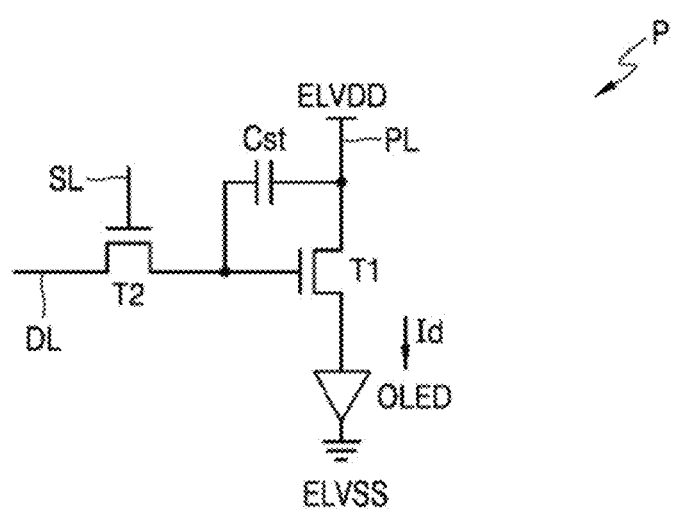
FIG. 2 is an equivalent circuit diagram of one pixel located in a display area of a display device according to an exemplary embodiment of the present invention.

FIG. 2 is an equivalent circuit diagram of one pixel located in a display area of a display device according to an exemplary embodiment of the present invention. FIG. 2 illustrates an example in which a pixel P includes an OLED.

Referring to FIG. 2, the pixel P may include a first thin film transistor (TFT) T1, a second TFT T2, a storage capacitor Cst, and an OLED.

The second TFT T2 may be a switching TFT and may be connected to a scan line SL and a data line DL. The second TFT T2 may transfer a data voltage input from the data line DL to the first TFT T1 in response to a switching voltage input from the scan line SL.

The storage capacitor Cst may be connected to the second TFT T2 and a driving voltage line PL, and may store a voltage corresponding to a difference between a voltage transferred from the second TFT T2 and a voltage ELVDD supplied through the driving voltage line PL.

The first TFT T1 may be a driving TFT, may be connected to the driving voltage line PL and the storage capacitor Cst, and may control a driving current Id flowing through the OLED from the driving voltage line PL in response to the voltage stored in the storage capacitor Cst. The OLED may emit light having a preset brightness by using the driving current Id. For example, the OLED may emit red, green, blue, or white light.

As an example, a circuit unit of the pixel P including the two TFTs and one storage capacitor is described with reference to FIG. 2; however, exemplary embodiments of the present invention are not limited thereto. Thus, a high-quality image may be displayed by the display device according to an exemplary embodiment of the present invention having a different design of the circuit unit connected to the OLED of the pixel P. For example, the pixel P may include three or more TFTs and/or two or more storage capacitors.

Figure 3:
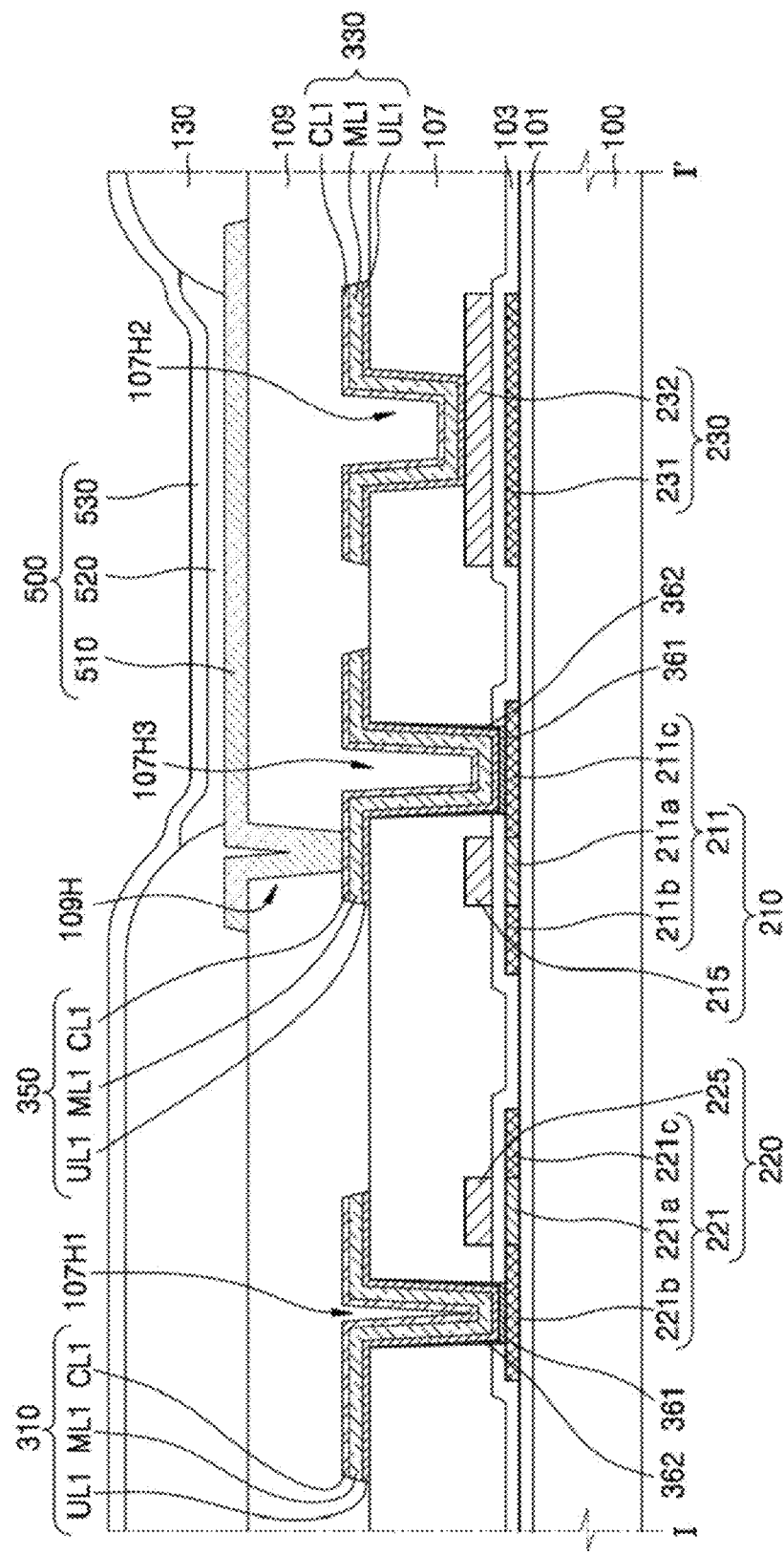
FIG. 3 is a cross-sectional view of a display area of a display device according to an exemplary embodiment of the present invention.

FIG. 3 is a cross-sectional view of a display area of a display device according to an exemplary embodiment of the present invention. FIG. 3 is a cross-sectional view of the display area taken along line I-I' of FIG. 1.

Referring to FIG. 3, a buffer layer 101 may be disposed on the substrate 100. The substrate 100 may include various flexible, rollable, and bendable materials (e.g. polymer resins). For example, the substrate 100 may include a polymer such as polyethylene terephthalate (PET), polyethylene naphthalate (PEN), or polyimide.

The buffer layer 101 may block foreign substances or moisture from penetrating through the substrate 100. For example, the buffer layer 101 may include an inorganic insulating material such as SiOx, SiNx, and/or SiON. The buffer layer 101 may have a single layer structure or a multi-layer structure.

First and second TFTs 210 and 220 may respectively include first and second semiconductor layers 211 and 221, and first and second gate electrodes 215 and 225.

The first and second semiconductor layers 211 and 221 may be disposed on the buffer layer 101, and may include amorphous silicon or polycrystalline silicon. The first semiconductor layer 211 may include a first channel region 211a, and a first source region 211b and a first drain region 211c respectively located at opposite sides of the first channel region 211a. The second semiconductor layer 221 may include a second channel region 221a, and a second source region 221b and a second drain region 221c respectively located at opposite sides of the second channel region 221a. The first and second source regions 211b and 221b, and the first and second drain regions 211c and 221c may be respectively doped with impurities of higher concentration than that of the first and second channel regions 211a and 221a. The impurities may include N-type impurities or P-type impurities.

First and second gate electrodes 215 and 225 may respectively overlap the first and second semiconductor layers 211 and 221 with a gate insulating layer 103 therebetween. The first and second gate electrodes 215 and 225 may respectively overlap the first and second semiconductor layers 211 and 221 along a direction orthogonal to an upper surface of the substrate 100. For example, the first gate electrode 215 may overlap the first channel region 211a of the first semiconductor layer 211, and the second gate electrode 225 may overlap the second channel region 221a of the second semiconductor layer 221. The gate insulating layer 103 may include an inorganic insulating layer such as SiOx, SiNx, and/or SiON. The gate insulating layer 103 may have a single layer structure or a multi-layer structure.

The storage capacitor 230 may include first and second electrodes 231 and 232. In an exemplary embodiment of the present invention, the first electrode 231 may include a same material as that of the first and second semiconductor layers 211 and 221, and the second electrode 232 may include a same material as that of the first and second gate electrodes 215 and 225.

As an example, the gate insulating layer 103 may substantially entirely cover the substrate 100; however, exemplary embodiments of the present invention are not limited thereto. The gate insulating layer 103 may be formed during a same mask process as that of the first and second gate electrodes 215 and 225 and the second electrode 232. Thus, the gate insulating layer 103 may be patterned to overlap the first and second gate electrodes 215 and 225 and the second electrode 232.

According to an exemplary embodiment of the present invention, each of the first semiconductor layer 211, the second semiconductor layer 221 and the first electrode 231 may be disposed on the substrate 100 (e.g., with the buffer layer 101 therebetween). The gate insulating layer 103 may be conformally disposed on upper surfaces of the buffer layer 101 and upper surfaces of each of the first semiconductor layer 211, the second semiconductor layer 221 and the first electrode 231. The first gate electrode 215 and the second gate electrode 225 may be disposed on the gate insulating layer 103. Thus, the first gate electrode 215 and the second gate electrode 225 may be in direct contact with the gate insulating layer 103.

According to an exemplary embodiment of the present invention, the first gate electrode 215 may be aligned with the first channel region 211a above the substrate 100 (e.g., along a direction orthogonal to an upper surface of the substrate 100). The second gate electrode may be aligned with the second channel region 221a (e.g., along the direction orthogonal to the upper surface of the substrate 100).

According to an exemplary embodiment of the present invention, the first gate electrode 215 may be spaced apart from the third contact hole 107H3 adjacent thereto, and the second gate electrode 225 may be spaced apart from the first contact hole 107H1 adjacent thereto.

The first and second TFTs 210 and 220 may be covered by a first insulating layer 107. The first insulating layer 107 may be an organic insulating layer. The first insulating layer 107 may be an insulating layer which may substantially entirely cover the display area DA (see, e.g., FIG. 1). The first insulating layer 107 including the organic insulating layer may be relatively flexible compared with an inorganic insulating layer (e.g., the first insulating layer 107 may be relatively strong against stress), and thus the display area DA (see, e.g., FIG. 1) may be rolled, curved or bent. As an example, the display area DA may be substantially fixed in a curved state. The first insulating layer 107 may include a general-purpose polymer such as an imide-based polymer, polymethylmethacrylate (PMMA) or polystyrene (PS), or polymer derivatives having a phenol-based group, an acryl-based polymer, an aryl ether-based polymer, an amide-based polymer, a fluorine-based polymer, a p-xylene-based polymer, a vinyl alcohol-based polymer, or a blend thereof. In an exemplary embodiment of the present invention, the first insulating layer 107 may include polyimide.

A data line 310 may be disposed on the first insulating layer 107 and may be electrically connected to the second TFT 220. For example, the data line 310 may be connected to a part of the second semiconductor layer 221, for example, the second source region 221b through a first contact hole 107H1 defined in the first insulating layer 107. The data line 310 connected to the second source region 221b of the second semiconductor layer 221 may be a part of a source electrode of the second TFT 220.

The driving voltage line 330 may be disposed on the first insulating layer 107. The driving voltage line 330 may be connected to the second electrode 232 of the storage capacitor 230 through a second contact hole 107H2 formed in the first insulating layer 107. The driving voltage line 330 may provide a voltage of a preset level, for example, the driving voltage ELVDD (see, e.g., FIG. 2).

A connection conductor 350 may be disposed on the first insulating layer 107, and may electrically connect the first TFT 210 to a pixel electrode 510. The connection conductor 350 may be referred to as a conductive layer. For example, the connection conductor 350 may be connected to the semiconductor layer, for example, the first drain region 211c of the first semiconductor layer 211 through a third contact hole 107H3 defined in the first insulating layer 107. The pixel electrode 510 may be connected to the connection conductor 350 through a contact hole 109H formed in a second insulating layer 109. The connection conductor 350 connected to the first drain region 211c of the first semiconductor layer 211 may be a part of a drain electrode of the first TFT 210.

Conductive layers such as the data line 310, the driving voltage line 330, and the connection conductor 350 may be substantially covered by the second insulating layer 109. The second insulating layer 109 may be an organic insulating layer and may include, for example, a general-purpose polymer such as an imide-based polymer, PMMA or PS, or polymer derivatives having a phenol-based group, an acryl-based polymer, an aryl ether-based polymer, an amide-based polymer, a fluorine-based polymer, a p-xylene-based polymer, a vinyl alcohol-based polymer, or a blend thereof.

The pixel electrode 510 may be disposed on the second insulating layer 109 (e.g., on an upper surface of the second insulating layer 109) and may be electrically connected to the circuit unit including the above-described conductive layers disposed over the substrate 100. A pixel-defining layer 130 including an opening exposing the pixel electrode 510 may be disposed on the pixel electrode 510. The pixel-defining layer 130 may prevent an arc from occurring between the pixel electrode 510 and the opposite electrode 530 by increasing a distance between the edge of the pixel electrode 510 and the opposite electrode 530. The pixel-defining layer 130 may include, for example, an organic insulating material such as polyimide or hexamethyldisiloxane (HMDSO).

An intermediate layer 520 may include a relatively low molecular weight or polymer material. When the intermediate layer 520 includes a relatively low molecular weight material, the intermediate layer 520 may have a structure in which a hole injection layer (HIL), a hole transport layer (HTL), an emission layer (EML1), an electron transport layer (ETL), and/or an electron injection layer (EIL) are stacked. When the intermediate layer 520 includes a polymer material, the intermediate layer 520 may generally have a structure including the HTL and the EML1. The structure of the intermediate layer 520 is not limited to the above-described structure and may have various structures. For example, at least one of the layers of the intermediate layer 520 may have one body to substantially entirely cover the display area DA (see, e.g., FIG. 1), For example, at least one of the layers of the intermediate layer 520 may substantially cover an upper surface of the pixel-defining layer 130.

The opposite electrode 530 may be disposed on the intermediate layer 520 and may substantially entirely covering the display area DA (see, e.g., FIG. 1). In an exemplary embodiment of the present invention, light emitted from an OLED 500 including the pixel electrode 510, the intermediate layer 520, and the opposite electrode 530 may be viewed in a direction away from the substrate 100 (e.g., in a plan view), for example, viewed from the outside through the opposite electrode 530 having light transmittance. However, exemplary embodiments of the present invention are not limited thereto. In an exemplary embodiment of the present invention, light emitted from the OLED 500 may be viewed from the outside through the substrate 100.

A lower portion of the conductive layers on the first insulating layer 107 may includes metal nitride. For example, each lower portions of the data line 310, the driving voltage line 330, and the connection conductor 350 may be a lowest layer which includes a metal nitride. Conductive layers such as data line 310, the driving voltage line 330, and the connection conductor 350 may each have a multi-layered structure, and a bottommost layer of the multi-layer structure may be a metal nitride layer. For example, each of the data line 310, the driving voltage line 330, and the connection conductor 350 may include the bottommost layer which is an underlayer UL1.

The underlayer UL1 of the conductive layers such as the data line 310, the driving voltage line 330, and the connection conductor 350 may include a metal nitride layer, and a metal layer ML1 may be disposed on the underlayer UL1. The metal layer ML1 may be substantially covered by a cover layer CL1. Each of the underlayer UL1, the metal layer ML1 and the cover layer CL1 may include a first part corresponding to an upper surface of the first insulating layer 107, a second part corresponding to a bottom of the contact hole and a third part corresponding to a side surface of the contact hole.

The underlayer UL1 may be a metal nitride layer including first metal. The first metal may include at least one of Ti, Ta, Nb, or W, and thus the underlayer UL1 may include at least one of titanium nitride, tantalum nitride, niobium nitride, or tungsten nitride. The metal layer MU may include a metal having a relatively small resistance such as Mo, Al, Cu, or Ti. The cover layer CU may include metal different from the metal included in the metal layer ML1, and may prevent the metal layer ML1 from being damaged or oxidized. In an exemplary embodiment of the present invention, the underlayer UL1, the metal layer ML1, and the cover layer CL1 may be TiN/Al/Ti, however, exemplary embodiments of the present invention are not limited thereto.

The underlayer UL1 of the conductive layer may be in direct contact with the first insulating layer 107 (e.g., the first insulating layer 107 may include the organic insulating layer) disposed thereunder. A bottom surface of the underlayer UL1 may be in direct contact with an upper surface of the first insulating layer 107. When the underlayer UL1 includes a metal nitride layer, it may prevent a metal from coupling to oxygen included in the organic insulating layer and may prevent an oxidation layer from being formed. As a comparative example, in the case where the underlayer of the conductive layer is a titanium layer, the titanium may couple to oxygen of the first insulating layer 107, which is the organic insulating layer, and a titanium oxidation layer may be formed. The titanium oxidation layer may remain on the first insulating layer 107 and may be viewed as stain to a user. According to an exemplary embodiment of the present invention, the underlayer UL1 including a metal nitride layer may prevent or minimize the forming of the oxidation layer by forming the underlayer UL1 of the conductive layer in direct contact with the first insulating layer 107.

The thickness of the underlayer UL1 may be about 30 Å or more. In the case where the thickness of the underlayer UL1 is less than 30 Å, stain may be viewed from the outside. In the case where the thickness of the underlayer UL1 is about 30 Å or more, a stain may be prevented from being viewed from the outside (see, e.g., Table 1 below). Thicknesses of the metal layer ML1 and the cover layer CL1 may be greater than a thickness of the underlayer UL1, and the thickness of the metal layer ML1 may be greater than the thickness of the cover layer CL1. The thickness of the metal layer ML1 may be several thousand Å, and the thickness of the cover layer CL1 may be several hundred Å.

TABLE 1

| Conductive layer | | | |
| --- | --- | --- | --- |
| Cover layer (CL1): Ti | Metal layer (ML1): Al | Under layer (UL1): TiN | Whether stain is viewed after dry etching |
| 300 Å | 6000 Å | 10 Å | Strong stain viewed |
| 300 Å | 6000 Å | 20 Å | Weak stain viewed |
| 300 Å | 6000 Å | 30 Å | No stain |
| 300 Å | 6000 Å | 40 Å | No stain |
| 300 Å | 6000 Å | 50 Å | No stain |

The driving voltage line 330 among the above-described conductive layers may be connected to a conductor under the first insulating layer 107, for example, the second electrode 232 through the second contact hole 107H2 of the first insulating layer 107. For example, the underlayer UL1 of the driving voltage line 330 may be in direct contact with the second electrode 232 of the storage capacitor 230 through the second contact hole 107H2.

At least one of the above-described conductive layers, for example, the data line 310 and the connection conductor 350 may be connected to a semiconductor layer. Referring to FIG. 3, the data line 310 may be connected to the second semiconductor layer 221 through the first contact hole 107H1 of the first insulating layer 107, and the connection conductor 350 may be connected to the first semiconductor layer 211 through the third contact hole 107H3 of the first insulating layer 107. A contact layer 361 may be disposed in connection regions.

The contact layer (connection layer) 361 may reduce a resistance between the underlayer UL1 and the semiconductor layer (e.g. the first and second semiconductor layers 211 and 221). The contact layer 361 may include a metal silicide layer. The metal silicide layer comprises a second metal. For example, the second metal of the silicide layer including metal such as Ti, Ta, W, Co, or Ni.

The contact layer 361 may be disposed on a region of the semiconductor layer 211 exposed through the contact hole. The contact layer 361 may overlap the contact hole along a direction orthogonal to an upper surface of the substrate 100. As shown in FIG. 3, each contact layer 361 may overlap each of the first and third contact holes 107H1 and 107H3.

The contact layer 361 may disposed within the contact hole (e,g,. the first or third contact holes 107H1 or 107H3). For example, the width of the contact layer 361 under the data line 310 may be substantially the same as a width of a region of the second semiconductor layer 221 which is exposed via the first contact hole 107H1. The width of the contact layer 361 under the connection conductor 350 may be substantially the same as a width of a region of the first semiconductor layer 211 which is exposed via the third contact hole 107H3. The underlayer UL1 of each data line 310 and connection conductor 350 may be in direct contact with the contact layer 361.

The contact layers 361 may be formed in the bottom of the first and third contact holes 107H1 and 107H3, respectively. Side layers 362 may be formed on inner walls of the first and third contact holes 107H1 and 107H3, respectively. Metal included in the side layer 362 may be the same as metal included in the contact layer 361, and each of the side layers 362 may substantially entirely cover or partially cover the inner wall depending on a slope angle of the inner wall of each of the first and third contact holes 107H1 and 107H3.

FIGS. 4 to 9 are cross-sectional views of a process of forming a data line among conductive layers in a manufacturing process of a display device, according to an exemplary embodiment of the present invention.

Figure 4:
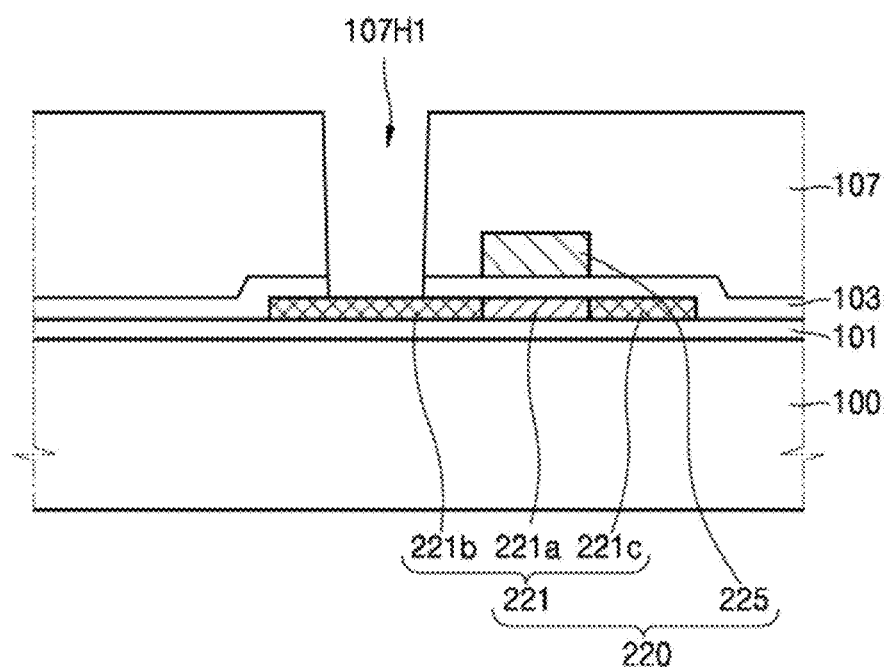
FIGS. 4 to 9 are cross-sectional views of a process of forming a data line among conductive layers in a manufacturing process of a display device, according to an exemplary embodiment of the present invention.

Referring to FIG. 4, the buffer layer 101 may be formed on the substrate 100, and the second semiconductor layer 221 may be formed on the buffer layer 101. The gate insulating layer 103 may be formed and the second gate electrode 225 may be formed. The second channel region 221a, the second source and drain regions 221b and 221c may be formed by doping the second semiconductor layer 221 with impurities by using the second gate electrode 225 as a self-align mask.

The first insulating layer 107 may be formed, and the first contact hole 107H1 may be formed in the first insulating layer 107 exposing a part (or region) of the second semiconductor layer 221, for example, the second source region 221b. The materials of the substrate 100, the buffer layer 101, the second semiconductor layer 221, the second gate electrode 225, and the first insulating layer 107 may be the same as those described in more detail above with reference to FIG. 3.

Figure 5:
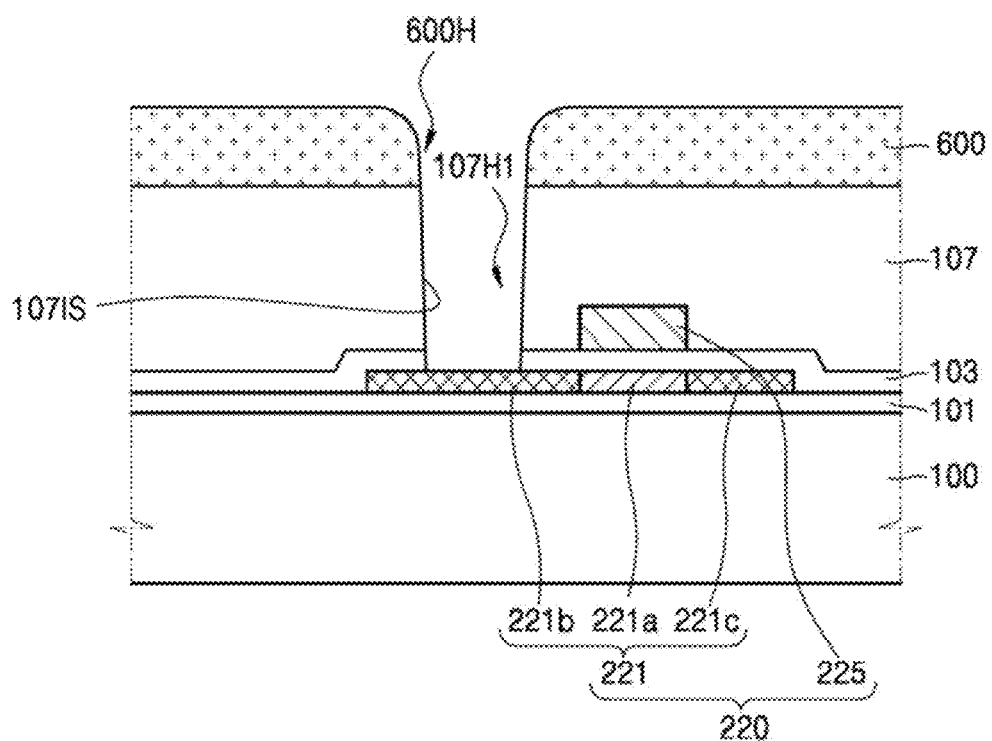

Referring to FIG. 5, a photoresist 600 including a hole 600H in a position corresponding to that of the first contact hole 107H1 may be formed on the first insulating layer 107. The photoresist 600 including the hole 600H may be formed by exposure and development processes.

Figure 6:
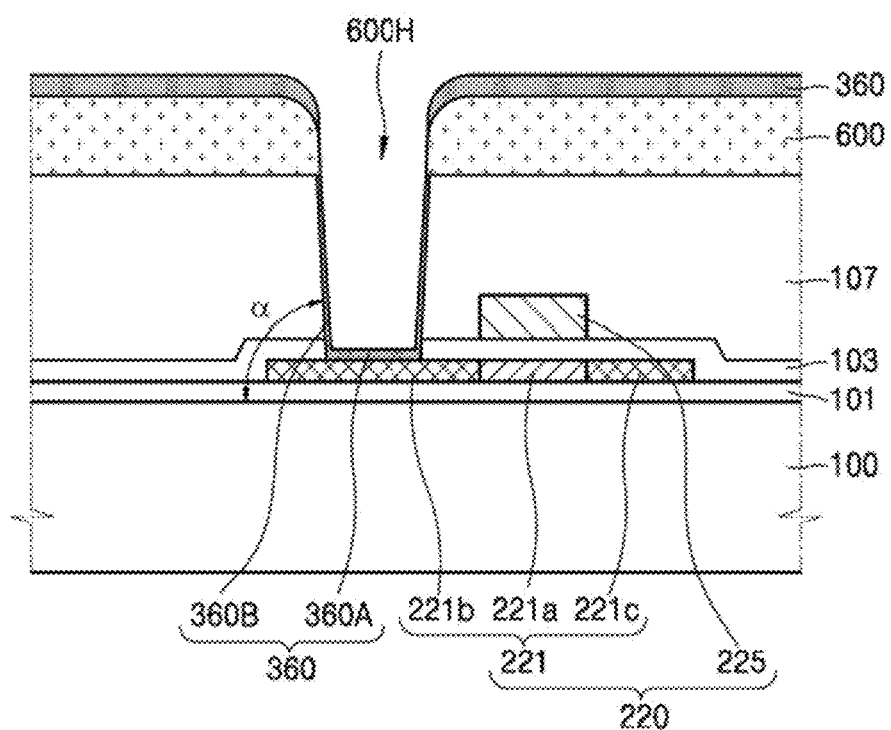
Figure 7:
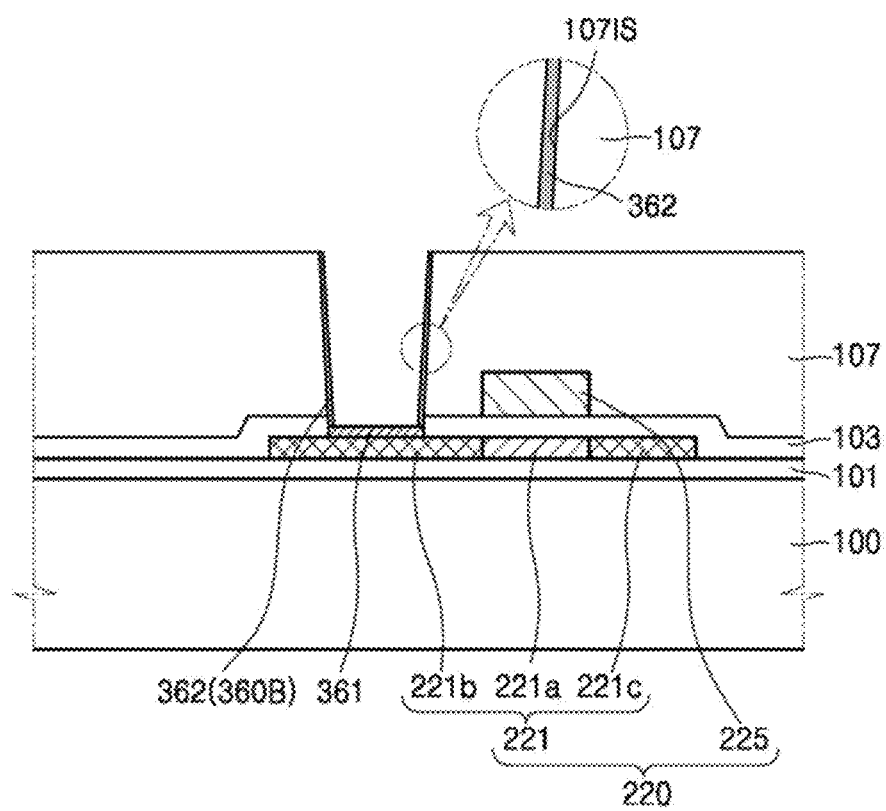

Referring to FIG. 6, a layer 360 including a second metal may be formed above the substrate 100. The second metal of the layer 360 may include Ti, Ta, W, Co, or Ni.

A first region 360A of the layer 360 may be formed in the hole 600H of the photoresist 600 and the second semiconductor layer 221 may be exposed through the first contact hole 107H1. A second region 360B of the layer 360 may be substantially entirely or partially formed on the inner wall 107IS depending on a slope angle α of the inner wall 107IS of the first contact hole 107H1. For example, when the slope angle α of the inner wall 107IS is relatively large, the second region 360B of the layer 360 may partially cover the inner wall 107IS, and when the slope angle α of the inner wall 107IS is relatively small, the second region 360B of the layer 360 may substantially entirely cover the inner wall 107IS. According to an exemplary embodiment of the present invention, the first contact hole 107H1 may be formed in a relatively small size, and the slope angle α of the inner wall 107IS may be relatively large (e.g., from about 70° to about 90°).

Since an inner wall of the hole 600H of the photoresist 600 may be formed at a relatively large slope angle, the layer 360 need not be formed on the inner wall of the hole 600H of the photoresist 600.

The photoresist 600 may be removed. While the photoresist 600 is removed, the layer 360 located on an upper surface of the photoresist 600 may be removed (see, e.g., FIG. 7).

The contact layer 361 may be formed by performing annealing. Through annealing, the metal included in the first region 360A of the layer 360 described with reference to FIG. 6 may react to silicon included in the second semiconductor layer 221, and the contact layer 361 including metal silicide may be formed. The second region 360B of the layer 360 may remain on the inner wall 107IS of the first contact hole 107H1 to form the side layer 362.

Figure 8:
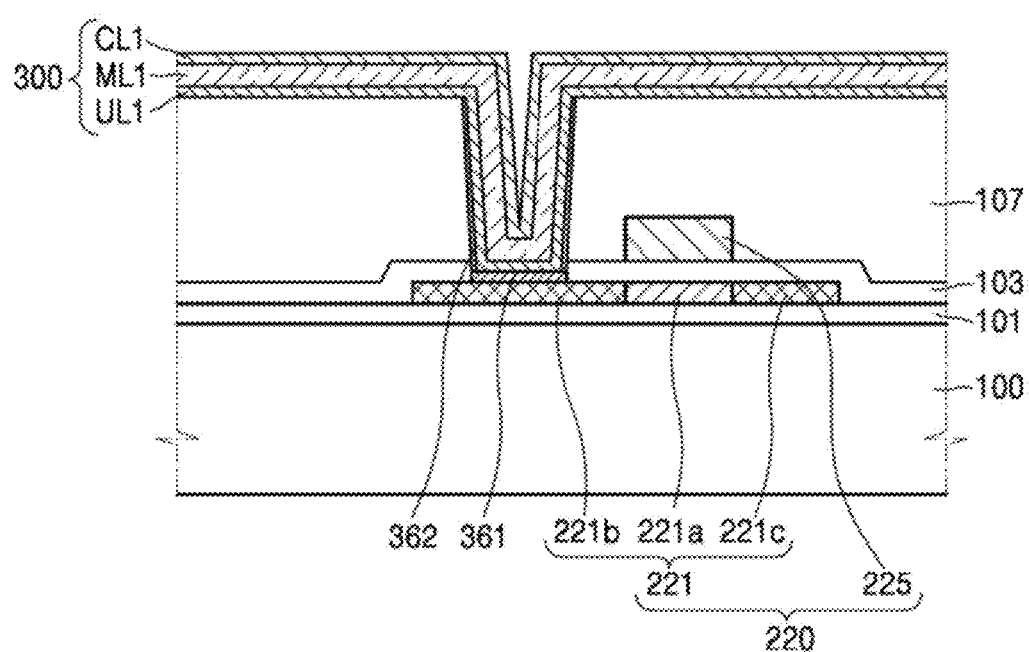
Figure 9:
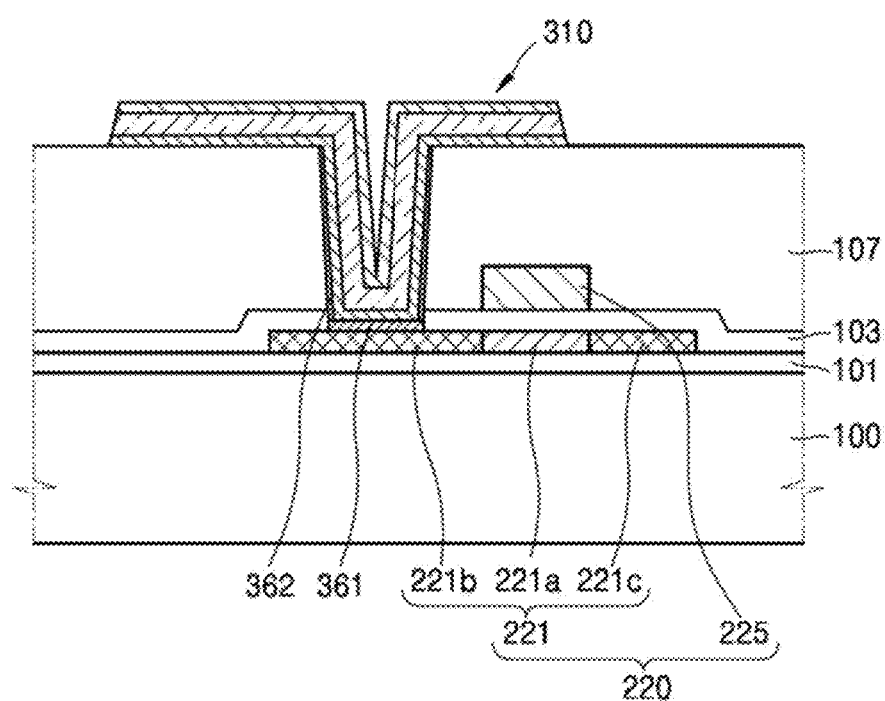

Referring to FIG. 8, a conductive material layer 300 including the underlayer UL1, the metal layer ML1, and the cover layer CL1 may be formed, and the data line 310 may be formed (see, e.g., FIG. 9) by etching the conductive material layer 300. In an exemplary embodiment of the present invention, the conductive material layer 300 may be formed by a sputtering process, and the etching process for forming the data line 310 may be a dry etching process.

Although an exemplary process for forming the data line 310 has been described with reference to FIGS. 4 to 9, exemplary embodiments of the present invention are not limited thereto. The connection conductor 350 (see, e.g., FIG. 3) may be formed by the same process as the process of forming the data line 310, and may be formed by using the same mask as a mask used for forming the data line 310. The driving voltage line 330 (see, e.g., FIG. 3) may be formed substantially simultaneously with the data line 310 and may be formed by a same process as a process of forming the data line 310. However, since the driving voltage line 330 may be in direct contact with the second electrode 232, the second contact hole 107H2 exposing the second electrode 232 may be covered by the photoresist 600 during the process described with reference to FIGS. 5 and 6.

Exemplary embodiments of the present invention may prevent a stain, which may occur in the case where the underlayer UL1 is a metal layer including metal such as Ti, from being viewed by a user by forming the underlayer UL1 of the conductive material layer 300 with a metal nitride layer. In an exemplary embodiment of the present invention, a mol ratio (N/M, where N is nitrogen and M is metal) of nitrogen to metal included in the underlayer UL1 may be greater than 0.8. For example, when metal is titanium, $0.8 < N/Ti \leq 1.15$. When N/Ti deviates from a lower limit of the above condition, silicon may diffuse to the data line 310 or the underlayer UL1 of the driving voltage line 330 during an annealing process, and a resistance may increase.

Although the annealing process may be performed before the conductive material layer 300 is formed in an exemplary embodiment of the present invention described with reference to FIGS. 4 to 9, exemplary embodiments of the present invention are not limited thereto. In an exemplary embodiment of the present invention, the annealing process may be performed after the conductive material layer 300 is formed. In an exemplary embodiment of the present invention, the annealing process may be performed after the conductive material layer 300 is formed and before a process of forming the pixel electrode.

The technical features of the first contact hole 107H1 are also applicable to the other contact holes described herein (e.g., the third contact hole 107H3). For example, the technical features described herein with reference to FIGS. 4-9 may be applied to the third contact hole 107H3.

Figure 10:
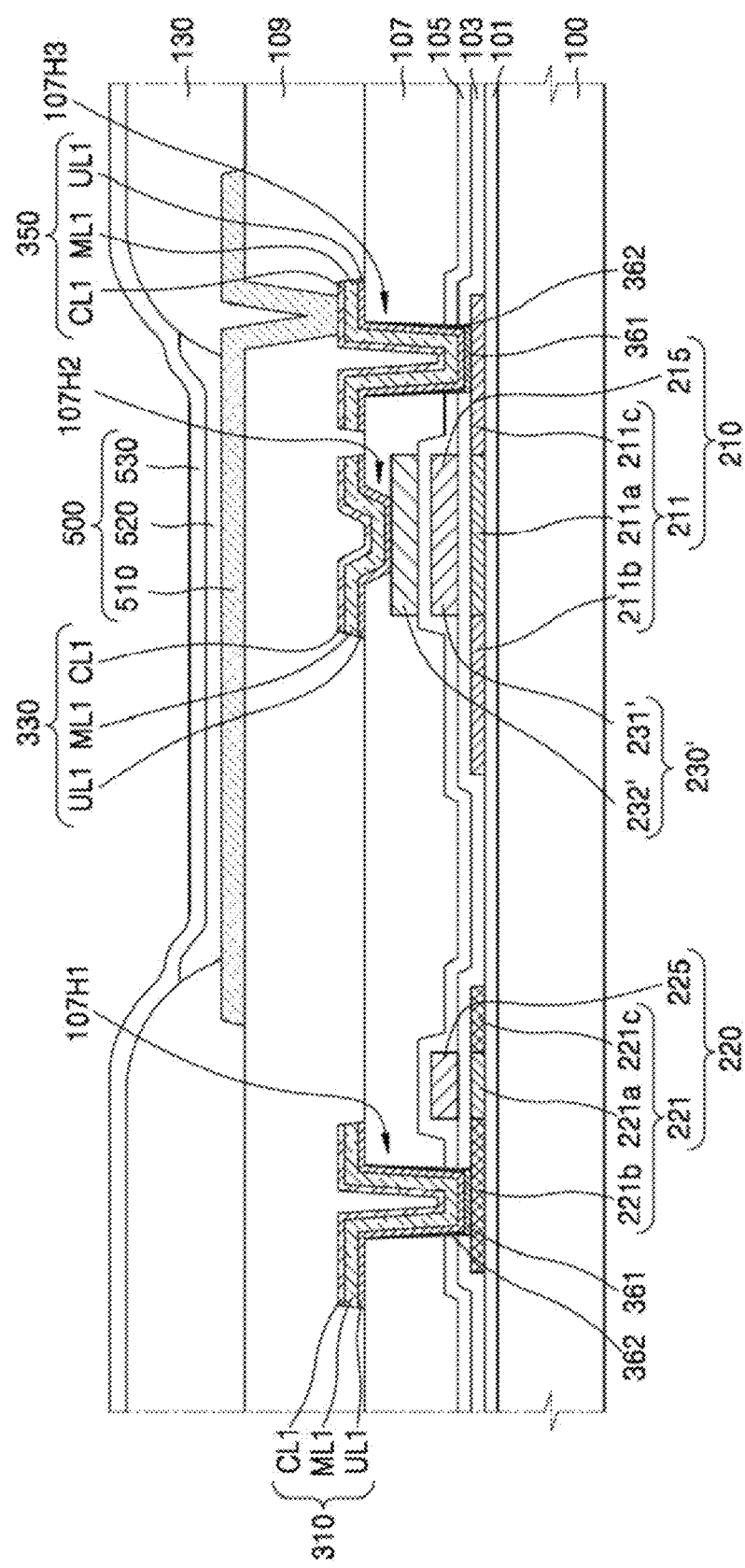
FIG. 10 is a cross-sectional view of a display area of a display device according to an exemplary embodiment of the present invention.

FIG. 10 is a cross-sectional view of a display area of a display device according to an exemplary embodiment of the present invention. FIG. 10 is a cross-sectional view of the display area taken along line of FIG. 1.

Referring to FIG. 10, a display device according to an exemplary embodiment of the present invention may include the conductive layers such as the data line 310, the driving voltage line 330, and the connection conductor 350. Each of the data line 310, the driving voltage line 330, and the connection conductor 350 may have a multi-layer structure including the under layer UL1, which may include a metal nitride layer (see, e.g., FIG. 3). The data line 310 and the driving voltage line 330 may be respectively connected to the semiconductor layers, for example, the second and first semiconductor layers 221 and 211. The contact layer 361 and the side layer 362 may be formed around the contact hole for connection between the data line 310 and the driving voltage line 330 and the semiconductor layers. Technical features that are the same or substantially the same as those described above (e.g., with reference to FIGS. 1 to 3) may be omitted below.

Referring to FIG. 10, a storage capacitor 230' connected to the driving voltage line 330 may overlap the first TFT 210. The storage capacitor 230' may include a first electrode 231' and a second electrode 232', and the first electrode 231' may serve as the first gate electrode 215 of the first TFT 210. The second electrode 232' may overlap the first gate electrode 215 and the first electrode 231° with an interlayer insulating layer 105 therebetween. The interlayer insulating layer 105 may include an inorganic insulating layer.

FIG. 11 is a cross-sectional view of a display area of a display device according to an exemplary embodiment of the present invention. FIG. 11 is a cross-sectional view of the display area taken along line I-I' of FIG. 1.

Referring to FIG. 11, a display device according to an exemplary embodiment of the present invention may include the conductive layers such as the data line 310, the driving voltage line 330, and the connection conductor 350 (see, e.g., FIGS. 3 and 10). The display device of FIG. 11 may further include a third insulating layer 108, and a driving voltage line and a connection conductor disposed thereon. Technical features that are the same or substantially the same as those described above (e.g., with reference to FIGS. 1 to 3 and 10) may be omitted below.

Like the driving voltage line 330 under the third insulating layer 108, the driving voltage line 430 on the third insulating layer 108 may provide the driving voltage ELVDD to the circuit unit. To discriminate the driving voltage line 430 on the third insulating layer 108 (e.g., on an upper surface of the third insulating layer 108) from the driving voltage line 330 disposed under the third insulating layer 108 (e.g., on a bottom surface of the third insulating layer 108), the driving voltage line 430 on the third insulating layer 108 may be referred to as the upper driving voltage line 430. Likewise, the connection conductor on the third insulating layer 108 may be referred to as the upper connection conductor 450.

The data line 310, the driving voltage line 330, and the connection conductor 350 may be substantially covered by the third insulating layer 108. A stacked structure of the conductive layers such as the data line 310, the driving voltage line 330, and the connection conductor 350, for example, the underlayer UL1, the metal layer ML1, and the cover layer CL1 may be the same as those described in more detail above with reference to FIGS. 3 to 10.

The upper driving voltage line 430 and the upper connection conductor 450 may be disposed on the third insulating layer 108. The third insulating layer 108 may include an organic insulating layer, and may include, for example, a general-purpose polymer such as an imide-based polymer, PMMA or PS, or polymer derivatives having a phenol-based group, an acryl-based polymer, an aryl ether-based polymer, an amide-based polymer, a fluorine-based polymer, a p-xylene-based polymer, a vinyl alcohol-based polymer, or a blend thereof.

The upper driving voltage line 430 may be disposed directly on the third insulating layer 108 to be in direct contact with an upper surface of the third insulating layer 108, and may be connected to the driving voltage line 330 disposed under the third insulating layer 108. For example, a part of the upper driving voltage line 430 may be in direct contact with an upper surface of the driving voltage line 330 exposed through a fourth contact hole 108H1.

The upper connection conductor 450 may be disposed directly on the third insulating layer 108 to be in direct contact with an upper surface of the third insulating layer 108, and may be connected to the connection conductor 350 disposed under the third insulating layer 108. For example, a part of the upper connection conductor 450 may be in direct contact with an upper surface of the connection conductor 350 exposed through a fifth contact hole 108H2. The upper connection conductor 450 may connect the connection conductor 350 to the pixel electrode 510.

An underlayer UL2 of the upper conductive layers such as the upper driving voltage line 430 and the upper connection conductor 450 may include a metal nitride layer, and a metal layer ML2 may be disposed on the underlayer UL2. The metal layer ML2 may be substantially covered by a cover layer CL2.

The underlayer UL2 may be a metal nitride layer and may include at least one of titanium nitride, tantalum nitride, niobium nitride, or tungsten nitride. The metal layer ML2 may include metal having a small resistance such as Mo, Al, Cu, or Ti. The cover layer CL2 may include a metal different a metal included in the metal layer ML2, and may prevent the metal layer ML2 from being damaged or oxidized during a process (e.g., a manufacturing process). In an exemplary embodiment of the present invention, although an underlayer UL2, a metal layer ML2, and a cover layer CL2 of the upper metal layer may be TiN/Al/Ti, exemplary embodiments of the present invention are not limited thereto.

The underlayer UL2 of the upper conductive layer may be in direct contact with the third insulating layer 108. When the underlayer UL2 includes the metal nitride layer, the underlayer UL2 may prevent the metal nitride from coupling to oxygen included in the organic insulating layer and prevent an oxidation layer from being formed, as described above in more detail.

The underlayer UL2 may have a thickness of about 30 Å or more and may prevent a stain from being viewed from the outside, and the metal layer ML2 and the cover layer CL2 may be formed in a thickness greater than a thickness of the underlayer UL2 as described above.

Referring to FIGS. 3 to 11, the connection conductor 350 and the upper connection conductor 450 may be connected to the first TFT 210, exemplary embodiments of the present invention are not limited thereto. Referring to FIG. 2, the circuit unit may further include a TFT connected to the first TFT 210 and the OLED. In this case, the added TFT may be electrically connected to the pixel electrode 510 by the connection conductor 350 and the upper connection conductor 450.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display device comprising:
   a substrate including a display area and a peripheral area outside the display area;
   a circuit unit disposed in the display area and including a semiconductor layer, a first insulating layer on the semiconductor layer, and a conductive layer connected to the semiconductor layer through a first contact hole in the first insulating layer, wherein the conductive layer includes a cover layer, a metal layer, and an underlayer including a metal nitride comprising a first metal, and wherein a part of a lower surface of the underlayer is in direct contact with an upper surface of the first insulating layer;
   a second insulating layer on the conductive layer and having a second contact hole, wherein the conductive layer comprises:
      a first region part overlapped by the second contact hole, wherein the first region part includes a portion of the cover layer, a portion of the metal layer, and a portion of the underlayer that each overlap a bottom surface of the second contact hole, and
      a second region part, an upper surface of the second region part of the conductive layer being in direct contact with a lower surface of the second insulating layer, and the second region part including a portion of the cover layer, a portion of the metal layer, and a portion of the underlayer;
   a display element disposed on the circuit unit and comprising a pixel electrode electrically connected to the conductive layer,
   a connection layer disposed under the conductive layer, wherein the connection layer corresponds to the first contact hole and comprises a second metal.

2. The display device of claim 1, wherein the first insulating layer includes an organic insulating layer.

3. The display device of claim 1, further comprising:
   a side layer located on at least a part of an inner wall of the first contact hole and comprising the second metal.

4. The display device of claim 1, wherein the underlayer comprises at least one of titanium nitride, tantalum nitride, niobium nitride, or tungsten nitride.

5. The display device of claim 1, wherein a thickness of the underlayer is about 30 Å or more.

6. The display device of claim 1, wherein the connection layer includes a metal silicide layer comprising the second metal, and wherein the second metal includes Ti, Ta, W, Co, or Ni.

7. The display device of claim 1, wherein the display element comprises an organic light-emitting diode.

8. The display device of claim 1, wherein the metal layer is disposed on the underlayer.

9. The display device of claim 8, wherein the metal layer comprises at least one of Mo, Al, Cu, or Ti.

10. The display device of claim 8, wherein a thickness of the metal layer is greater than a thickness of the underlayer.

11. A display device comprising:
    a substrate comprising a display area and a peripheral area outside the display area;
    a circuit unit disposed in the display area and comprising a semiconductor layer, a conductive layer and an organic insulating layer, wherein the conductive layer comprises a cover layer, a metal layer, and an underlayer comprising a metal nitride, a part of the underlayer being in direct contact with the organic insulating layer;
    an insulating layer on the organic insulating layer such that the conductive layer is between the organic insulating layer and the insulating layer,
    wherein the conductive layer comprises:
       a first region part overlapped by a contact hole of the insulating layer, wherein the first region part includes a portion of the cover layer, a portion of the metal layer, and a portion of the underlayer that each overlap a bottom surface of a second contact hole, and
       a second region part which is not overlapped by the contact hole of the insulating layer, the second region part including a portion of the cover layer, a portion of the metal layer, and a portion of the underlayer;
    a display element disposed on the circuit unit and comprising a pixel electrode electrically connected to the conductive layer.

12. The display device of claim 11, wherein a mol ratio of nitrogen to metal in the underlayer is greater than 0.8.

13. The display device of claim 11, wherein the circuit unit further comprises a thin film transistor, and a data line and a driving voltage line electrically connected to the thin film transistor, and the conductive layer is one of the data line and the driving voltage line.

14. The display device of claim 11, wherein the underlayer comprises a metal nitride layer and the metal layer is disposed on the metal nitride layer.

15. The display device of claim 14, wherein the metal nitride layer comprises at least one of titanium nitride, tantalum nitride, niobium nitride, or tungsten nitride.

16. The display device of claim 14, wherein the metal layer comprises at least one of Mo, Al, Cu, or Ti.

17. The display device of claim 14, wherein the cover layer is on the metal layer.

18. The display device of claim 14, wherein a thickness of the metal nitride layer is about 30 Å or more.

19. The display device of claim 14, wherein a thickness of the metal layer is greater than a thickness of the metal nitride layer.

20. The display device of claim 11, wherein the conductive layer is electrically connected to the semiconductor layer through a contact hole in the organic insulating layer.

21. The display device of claim 20, further comprising:
    a metal silicide layer disposed under the conductive layer.

22. The display device of claim 21, further comprising:
a side layer covering at least a part of an inner wall of the contact hole,
wherein a metal included in the side layer is the same as a metal included in the metal silicide layer.

23. The display device of claim 11, further comprising:
a metal element disposed under the organic insulating layer, and
wherein the conductive layer directly contacts the metal element through a contact hole in the organic insulating layer.

24. The display device of claim 23, wherein the circuit unit further comprises a storage capacitor, and the metal element is an electrode of the storage capacitor.

* * * * *